United States Patent [19]
Nishiguchi

[11] Patent Number: 5,098,501
[45] Date of Patent: Mar. 24, 1992

[54] PICKUP METHOD AND THE PICKUP APPARATUS FOR CHIP-TYPE PART

[75] Inventor: Masanori Nishiguchi, Yokohama, Japan

[73] Assignee: Sumitomo Electric Industries, Ltd., Osaka, Japan

[21] Appl. No.: 623,574

[22] Filed: Dec. 7, 1990

[30] Foreign Application Priority Data

| Dec. 8, 1989 [JP] | Japan | 1-319327 |
| Jun. 8, 1990 [JP] | Japan | 2-151278 |
| Jun. 8, 1990 [JP] | Japan | 2-151279 |
| Jun. 8, 1990 [JP] | Japan | 2-151280 |

[51] Int. Cl.$^5$ ............................................. B32B 31/28
[52] U.S. Cl. .................................. 156/275.5; 156/344; 156/379.6; 156/584; 29/426.5
[58] Field of Search ................. 156/584, 344, 379.6, 156/272.2, 275.5; 29/426.1, 426.3, 426.5; 250/492.1, 492.2

[56] References Cited

U.S. PATENT DOCUMENTS

| 4,718,967 | 1/1988 | Irie | 156/344 X |
| 4,720,317 | 1/1988 | Kuroda et al. | 156/344 X |
| 5,037,780 | 8/1991 | Fujimoto et al. | 29/841 X |

FOREIGN PATENT DOCUMENTS

| 62-47146 | 2/1987 | Japan | 156/584 |
| 62-128139 | 6/1987 | Japan | 156/584 |
| 62-232935 | 10/1987 | Japan | 156/584 |
| 63-92038 | 4/1988 | Japan | 156/344 |

Primary Examiner—Michael W. Ball
Assistant Examiner—Mark A. Osele
Attorney, Agent, or Firm—Cushman, Darby & Cushman

[57] ABSTRACT

The present invention has an object to provide a pickup method and the pickup apparatus for chip type part capable of storing a part of chip type part kept adhered with a sufficient adhesive strength on an adhesive layer such as an expanded tape for a storage purpose while the other part of chip type part is adhered on the adhesive layer for current use. In order to achieve the object, there is provided a pickup technique for chip type part wherein an energy beam is radiated on a part of adhesive layer fixing the chip type part.

19 Claims, 8 Drawing Sheets

PICKUP METHOD AND THE PICKUP APPARATUS FOR CHIP-TYPE PART

BACKGROUND OF THE INVENTION

1. Field of the Invention

The present invention relates to a method of peeling off a chip type part such as chip condenser or semiconductor chip, etc., fixed on an adhesive tape or the like and the pickup apparatus.

2. Related Background Art

In the process for manufacturing semiconductors, a semiconductor wafer is adhered to an expanded tape and diced into chips on the expanded tape, the diced chip type parts are generally peeled off from the expanded tape one by one, and the peeled chip is die-bonded in a predetermined package and is stored in a predetermined tray.

The adhesive is an adhesive tape having an adhesvie layer of an adhesive material on its surface. The adhesive material has a sufficient adhesive strength not to cause positional errors of the semiconductor devices during dicing of the semiconductor wafer into chips.

When the adhesive material which has a sufficient adhesive strength fixing a semiconductor having a back metal is used, the back metal may be peeled from the chip type part upon peeling of the chip type part from the adhesive tape. In the worst case, a deformation such as cracks in a chip type part is present.

In order to prevent the back metal from peeling off from the chip type part, the adhesive tape is irradiated with the ultraviolet beam to decrease the adhesive strength of the adhesive material before the chip type part is peeled off from the adhesive tape.

Since the entire lower surfce of the adhesive tape is irradiated with the ultraviolet beam in a conventional method, the adhesive strength of the entire adhesive tape is decreased upon radiation of the ultraviolet beam. The adhesive strength is naturally slightly decreased with a lapse of time. For this reason, assuming that the first half of chip type parts are left on the adhesive tape for current use, while the second half of chip parts are stored on the adhesive tape, the positions of the chip type parts are shifted due to an external force acting on them during storage. Therefore, storage of chip type parts on an adhesive tape is not suitable for re-storage.

SUMMARY OF THE INVENTION

It is an object of the present invention to provide a pickup method and the pickup apparatus for chip type part capable of storing the second half of chip type parts kept adhered with a sufficient adhesive strength on an adhesive layer such as an adhesive tape for a storage purpose while the first half of chip type parts is adhered on the adhesive layer for current use.

In order to achieve the above object, there is provided a method of picking up chip type part fixed on an adhesive layer formed on a tape member through which an energy beam is transmitted, the adhesive layer having an adhesive strength decreased upon radiation of the energy beam, comprising the steps of radiating the energy beam, through the tape member, onto only a predetermined portion of the adhesive layer to which the chip type is fixed, wherein said predetermined portion is less than the total surface area of the chip, and causing a collet to hold and peel off the chip type part.

According to the pickup method for chip type part described above, the adhesive strength of the adhesive layer for each chip part can be partially decreased.

And there is provided an apparatus for picking up chip type part fixed to an adhesive layer formed on a tape member through which an energy beam is transmitted, the adhesive layer having an adhesive strength which is decreased upon radiation of the energy beam, comprising radiation means for radiating the energy beam, through the tape member, onto only a predetermined portion of the adhesive layer to which the chip type part is fixed, and a collet for holding each chip type part and peeling off the chip type part.

With this operation, concentration of stresses acting on a chip type part when it is pushed up can be prevented, and the frequency of defects occuring in chip type part when it is pushed can be reduced. In addition, peeling of an adhesive tape starts from the predetermined portion of a chip type part which is fixed to a tape portion whose adhesive strength is decreased upon radiation of an energy beam. This allows the adhesive tape to be smoothly peeled off from the entire bottom surface of the chip type part.

The present invention will become more fully understood from the detailed description given hereinbelow and the accompanying drawings which are given way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The first embodiment of the present invention will be described with reference to FIGS. 1 to 4.

Figure 1A:
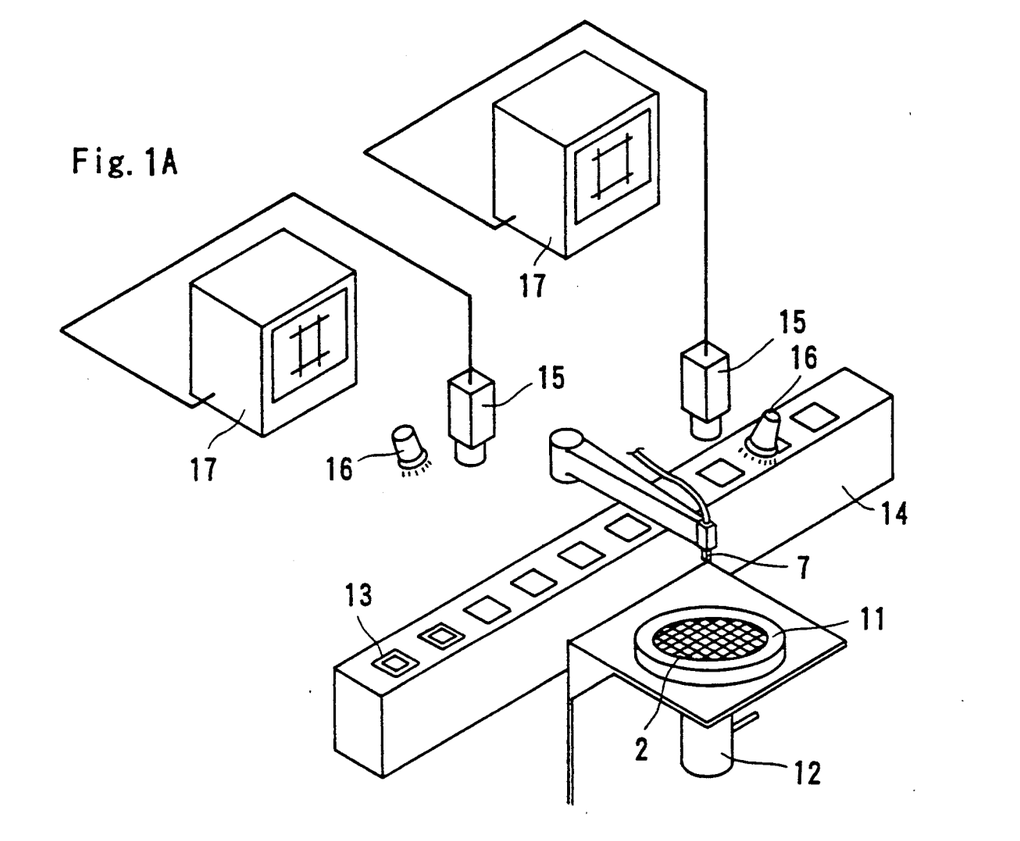
FIG. 1A is a perspective view showing a schematic structure of the pick up apparatus for chip type part and FIG. 1B is a vertical sectional view showing a state wherein the chip type part is pushed up toward collet by push-up pins.
Figure 1B:
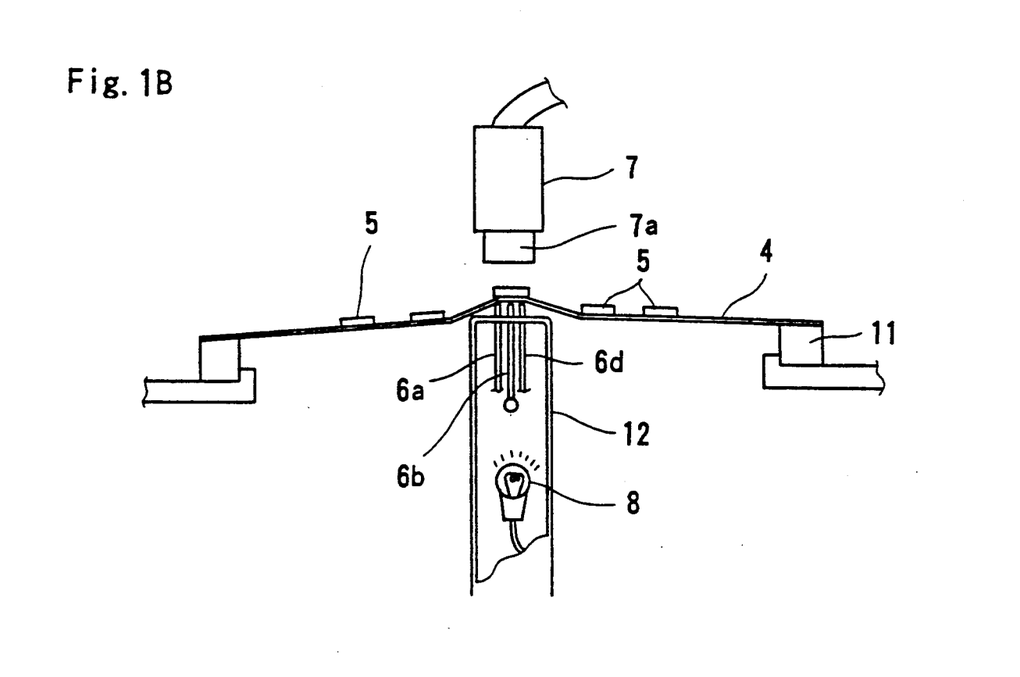

First, a schematic whole structure of pickup apparatus for chip type part according to one embodiment of the present invention will be explained in reference with FIGS. 1A and 1B.

The pickup apparatus for chip type part comprises a wafer ring 11 and a push up stage 12. An adhesive tape 4 fixing plurality of semiconductor chips 5 thereon is fixed by the wafer ring 11. And the push up stage 12 is arranged underneath the wafer ring 11. An ultraviolet source 8 is arranged inside of the push up stage 12 and plurality of push up pins 6a, 6b, 6c and 6d are arranged in upper portion of the push up stage 12. The push up pins, 6a, 6b, 6c and 6d are driven by a cam mechanism to move up and down. A collet 7 is arranged over the wafer ring 11 and move up and down to pick up a semiconductor chip 5. This collet 7 has an suction opening 7a forming a pyramid dent in the bottom portion thereof. The suction opening 7a is communicated with a vacuum device (not shown) to absorb the semiconductor chip 5. Further, a carrier device 14 having plurality of packages 13 forming a queue is arranged near the wafer ring 11. The semiconductor chip held by the collet 7 is to be placed on the package 13 to be carried in certain direction. A TV camera 15 and lighting device 16 are arranged over the carrier device 14. The TV camera 15 is connected to a TV monitor 17 to allow an operator to monitor the positioning between the package 13 and the semiconductor chip 5.

Figure 2:
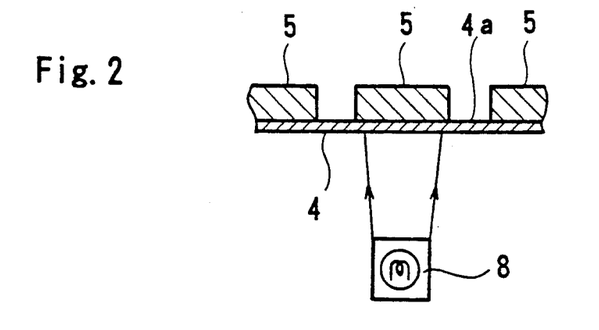
FIG. 2 is a vertical sectional view showing radiation of ultraviolet beam.

FIG. 2 shows a state in which the lower surface of an adhesive tape having a plurality of chip type parts fixed thereon is irradiated with an ultraviolet beam. An adhesive layer is formed on a surface 4a of an adhesive tape 4 and is made of an adhesive material whose adhesion strength is decreased upon radiation of the ultraviolet beam. A plurality of semiconductor chips 5 are adhered and fixed to this adhesive layer. When each chip 5 is to be peeled off from the adhesive tape 4, the lower surface of the adhesive tape 4, i.e., the adhesive layer, is irradiated with the ultraviolet beam from an ultraviolet source 8 to decrease the adhesive strength of the adhesive layer. At this time, in the pickup method for chip type part of the present invention, an adhesive layer portion to which one chip is fixed is irradiated wtih an ultraviolet beam every few seconds. Each chip corresponding to the adhesive layer portion which is irradiated with the ultraviolet beam and whose adhesive strength is decreased is peeled off from the adhesive tape. When the adhesive layer portion to which one chip 5 is fixed is irradiated with the ultraviolet beam, the ultraviolet beam is radiated within a predetermined area inside its peripheral portion by at least 0.1 mm. This ultraviolet radiation area is illustrated as a hatched portion in FIG. 2. The ultraviolet radiation area is limited inside the chip fixing portion due to the following reason.

Figure 3:
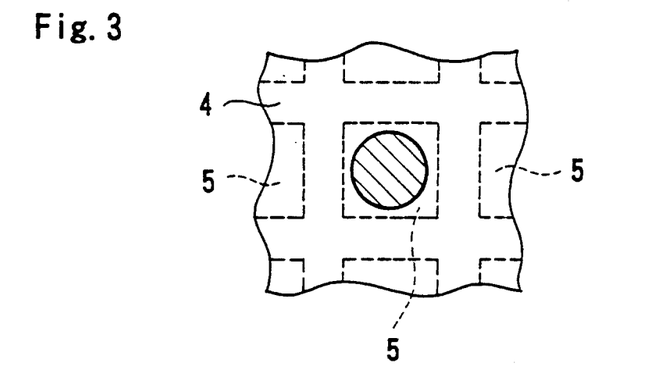
FIGS. 3 and 4 are bottom end views showin radiation areas of ultraviolet beams.

More specifically, assume that the ultraviolet radiation area expands outside the portion which fixes the chip 5, as indicated by a hatched portion in FIG. 3. Even if the radiation area does not reach the lower surface portion of an adjacent chip, the adhesive strength of the adhesive layer which fixes other adjacent chips 5 is decreased by propagation of a polymerization reaction of the adhesive material and oozing of the ultraviolet beam although the adhesive layer portions corresponding to these adjacent chips are not actually irradiated with the ultraviolet beam. For this reason, when chips 5 are to be stored while being kept adhered on the adhesive tape 4, the positions of the chips fixed near the portion irradiated with the ultraviolet rays tend to be shifted. According to the method of the present invention, however, a decrease in adhesive strength upon radiation of the ultraviolet beam does not occur except for the chip to be peeled off.

The ultraviolet source 8 may have a structure capable of radiating ultraviolet beam within the limited area, as described above. For example, there may be provided an arrangement capable of radiating an ultraviolet beam within the predetermined limited area from an ultraviolet source through a lens and a reflector or through a light guide.

The chip fixed to the portion whose adhesive strength is decreased is pushed up from the adhesive tape by push-up pins 6a to 6d. The peeled chip is chucked in vacuum by a collet 7. Therefore, the chips can be peeled off from the adhesive tape 4 one by one (Refer to FIG. 1B).

Figure 4:
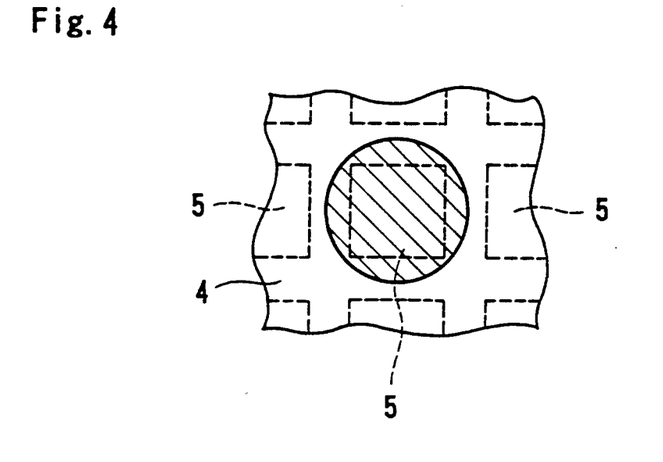

An ultraviolet radiation area limited in the range of the diameter of 0.8 mm inside the bottom surface adhered by the adhesive tape of the chip, as shown in FIG. 3, was compared with that expanding in the range of the diameter of 1.5 mm outside the bottom surface of the chip, as shown in FIG. 4, and changes in adhesion strength values of the chips on the adhesive layer portions upon radiation of ultraviolet beam were measured. Test results are shown in the table below. This table shows the adhesion strength obtained when a chip having an area of 1 mm² is peeled off from an adhesive tape which is expanded at an expansion ratio of 130%, and the adhesion strength values prior to radiation of the ultraviolet beam are 15 g.

|  | UltraViolet Radiation Area | |
| --- | --- | --- |
|  | Within Chip Bottom Surface 0.8 mmϕ (FIG. 3) | Outside Chip Bottom Surface 1.5 mmϕ (FIG. 4) |
| Adhesion Strength of Target Chip | (15 g) → 3 g | (15 g) → 1 g or less |
| Adhesion Strength of Adjacent Chip | (15 g) → 15 g | (15 g) → 5 g |

As is apparent from this table, the adhesion strength of the chip to be peeled off from the adhesive tape is decreased to 3 g upon radiation of the ultraviolet beam when the radiation area is limited within the bottom surface of the chip. However, this adhesion strength can facilitate peeling of the chip from the adhesive tape, thus posing no problem. To the contrary, when the adhesion strength of the chip adjacent to the target chip is taken into consideration, the adhesion strength is kept unchanged upon radiation of an ultraviolet beam within the radiation area falling within the bottom surface of the chip. No problem is presented to continuously adhere the chips on the adhesive tape. However, when the radiation range falls outside the bottom surface of the chip, the adhesion strength is decreased to 5 g. When this chip is kept adhered on the adhesive tape and is stored, a positional error tends to occur. This radiation range cannot be apparently suitable for chip re-storage.

The second embodiment of the present invention will be described below with reference to FIGS. 5 to 6.

Figure 5:
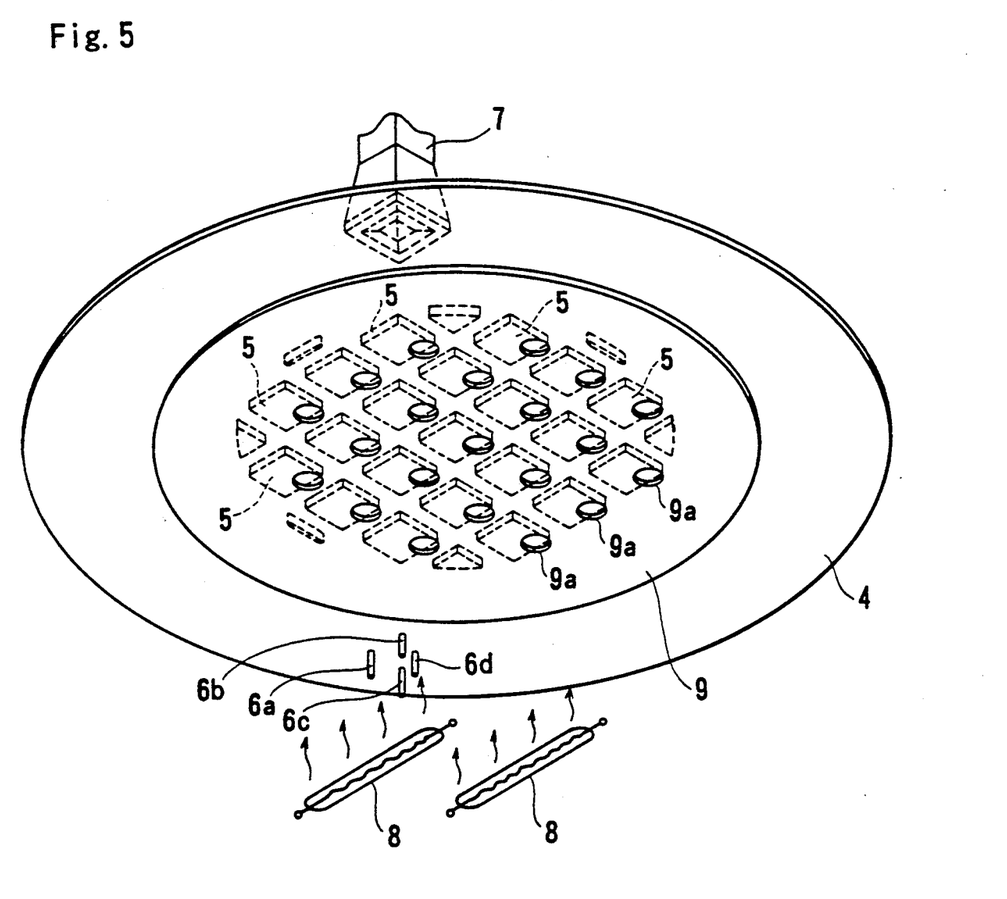
FIG. 5 is a schematic perspective view showing a characteristic feature of a pickup apparatus to which the present invention is applied.
Figure 6:
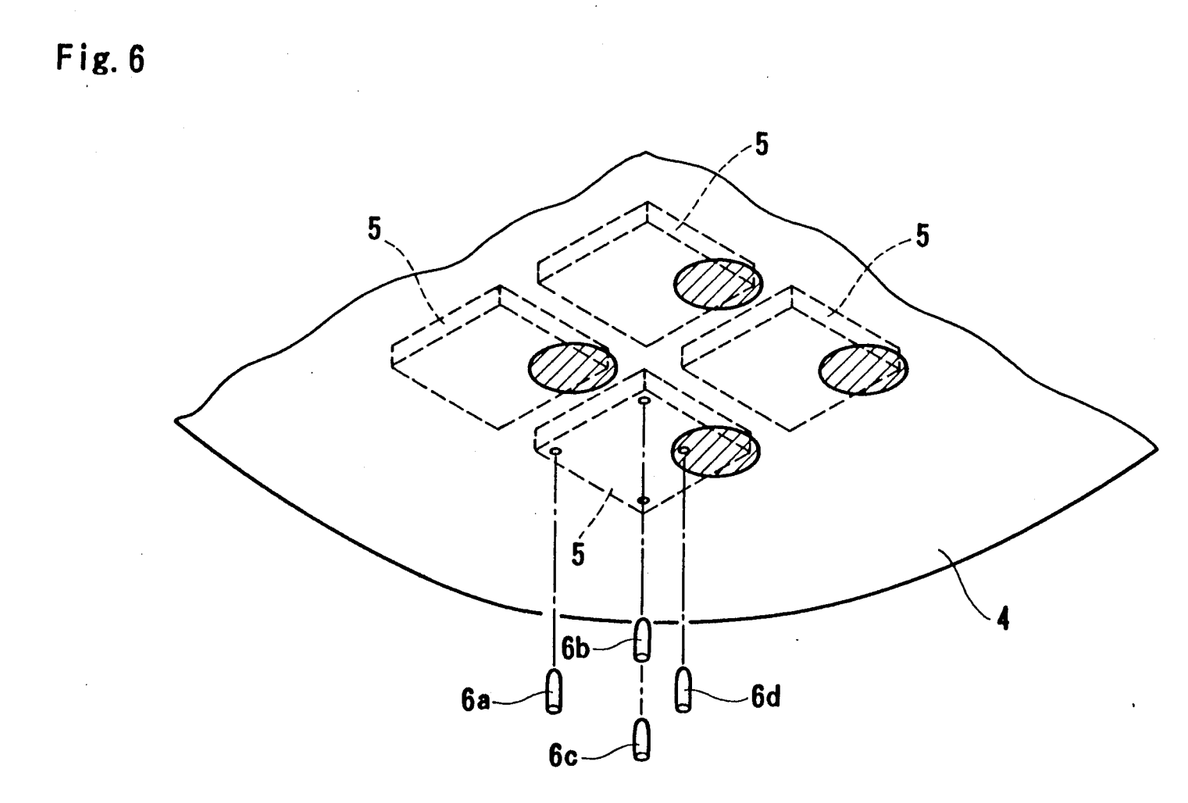
FIG. 6 is a perspective view showing an arrangement of push-up pins in relation to the bottom surface of a semiconductor chip.

FIG. 5 schematically shows a characteristic feature of a pickup apparatus for semiconductor chips to which the present invention is applied. This pickup apparatus comprises push-up means having push-up pins 6a and 6d for pushing up a plurality of semiconductor chips 5 adhered and fixed to the adhesive surface of an adhesive tape 4 one by one from the lower surface side of the adhesive tape 4 (the lower surface on which no semiconductor chips 5 are adhered and fixed), a collet 7 for chucking/holding the pushed semiconductor chips 5 from the upper surface side of the tape 4 one by one so as to peel them off from the tape 4 one by one, an ultraviolet source 8 for radiating an ultraviolet beam on the adhesive tape 4 from its lower surface side, and a mask 9, arranged between the ultraviolet source 8 and the adhesive tape 4, for allowing the ultraviolet beam to be transmitted through a predetermined portion. An adhesive material whose adhesive strength is decreased upon radiation of an ultraviolet beam is coated on the upper surface of the adhesive tape 4. The adhesive tape 4 is made of an electric resin or the like for transmitting an ultraviolet beam therethrough. If, therefore, an ultraviolet beam is radiated on the adhesive tape 4 from its lower surface side, the adhesive strength of a portion which receives the ultraviolet beam is decreased. The mask 9 is designed to allow an ultraviolet beam to be transmitted through only portions corresponding to corner portions of the semiconductor chips 5 fixed to the adhesive tape 4. For this purose, through holes 9a are formed in these portions of the mask 9, or only these portions are made of a material having transmissivity to ultraviolet light. Therefore, when an ultraviolet beam is radiated from the ultraviolet source 8 onto the adhesive tape 4 through the mask 9, the adhesive strength of only a portion, of a surface portion of the adhesive tape 4 to which each semiconductor chip 5 is fixed, to which a corner portion of each semiconductor chip 5 is fixed is decreased. That is, in this embodiment, the mask 9 and the ultraviolet source 8 constitute an ultraviolet radiation means for selectively rediating an ultraviolet beam to only a portion to which corner portion of each semiconductor chip 5 is fixed.

A push-up means for pushing up the semiconductor chips 5 from the lower surface side of the adhesive tape 4 comprises the four push-up pins, i.e., the push-up pins 6a to 6d, as described above. These push-up pins are arranged to be brought into contact with the lower surface of the adhesive tape 4 at four positions respectively separated from the four corners of each semiconductor chip 5, which is fixed to a tape surface portion whose adhesive strength is decreased upon radiation of an ultraviolet beam by a distance of 5% or more of the length of a digonal line of the square lower surface of the semiconductor chip 5, thereby pushing up the semiconductor chip 5. FIG. 6 is an enlarged view showing the arrangement of the push-up pins 6a to 6d in relation to the bottom surface of each semiconductor chip 5. Referring to FIG. 6, hatched portions are portions on which an ultraviolet beam is radiated. As shown in FIG. 6, in this embodiment, of the four push-up pins 6a to 6d, the push-up pins 6a to 6c are arranged at positions where they are brought into contact with corner portions of each semiconductor chip 5, which are fixed to portions receiving no ultraviolet beam, from the lower surface side of the adhesive tape 4, whereas the push-up 6d is arranged at a position where it is brought into contact with the lower surface of the adhesive tape 4 at a position separated from a corner portion of the semiconductor chip 5, which is fixed to a portion on which the ultraviolet beam is radiated, by a distance of 5% or more of the length of a diagonal line of the lower surface of the semiconductor chip 5 (a portion closer to the center of the chip 5).

The way in which semiconductor chips on an adhesive tape are picked up by the above-described pickup apparatus will be described below.

Figure 7:
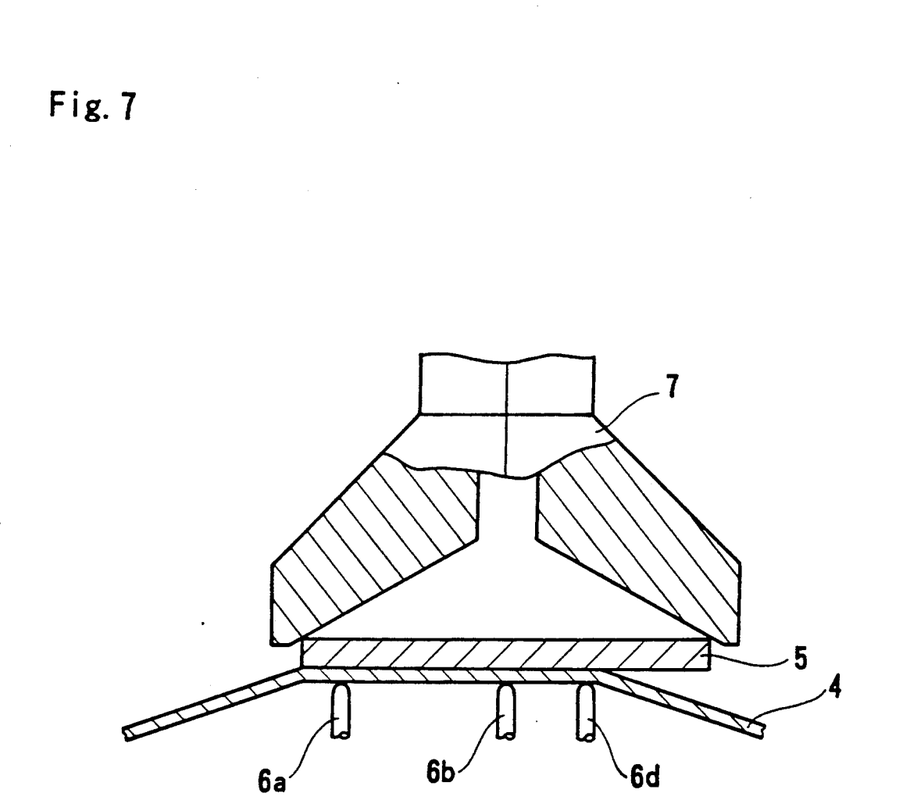
FIG. 7 is a vertical sectional view showing a state wherein peeling of an adhesive tape starts from a corner portion of a semiconductor chip.

When the adhesive tape 4 having the plurality of semiconductor chips 5 adhered and fixed thereto is set in the pickup apparatus, the mask 9 is positioned in correspondence with the arrangement of the semiconductor chips 5. An ultraviolet beam is then radiated from the ultraviolet source 8 to only a corner portion of each semiconductor chip 5. Upon radiation of the ultraviolet beam, the mask 9 is removed, and each semiconductor chip 5 is pushed up by the push-up means having the push-up pins 6a to 6d. When this push-up operation is performed, since the semiconductor chip 5 is pushed up by the plurality of push-up pins 6a to 6d, stresses generated by the push-up operation are not concentrated to one portion but are dispersed, thus reducing the frequency of defects, such as cracks and chips, occurring in the semiconductor chips 5. When the semiconductor chip 5 is pushed up, peeling of the adhesive tape 4 starts from the corner portion of the semiconductor chip 5 which is fixed to the portion of the adhesive taqpe 4 to which the ultraviolet beam is radiated its adhesive strength is decreased upon radiation of the ultraviolet beam. Since on push-up pins are present within a distance of 5% or less of the length of a diagonal line of the semiconductor chip 5 from the corner portion of the chip 5, the adhesive tape 4 starts peeling off from the corner portion. As a result, a portion of the adhesive tape 4 present within a radius of at least 5% of the diagonal line length from this corner portion is peeled off. FIG. 7 shows this state. The pushed-up semiconductor chip 5 is chucked and held by the collet 7 positioned above this semiconductor chip 5. When the collet 7 is moved upward, the semiconductor chip 5 is peeled off from the adhesive tape 4 to be picked up. In this case, if a portion of the peripheral portion of an adhesive area to which the semiconductor chip 5 is adhered and fixed (corresponding to the corner portion of the semiconductor chip 5 fixed to the area on which the ultraviolet beam is radiated) is peeled off, peeling of this portion facilitates a smooth peeling operation of the overall adhesive area even if the adhesive strength thereof is not decreased. Therefore, even a large, flattened semiconductor chip can be easily peeled off from an adhesive tape to be picked up without increasing the suction power of the collet 7.

In addition, assume that some of the semiconductor chips 5 adhered and fixed to the adhesive tape 4 are picked up, and the remaining semiconductor chips 5 are stored while they are kept adhered and fixed to the adhesive tape 4. Even in such a case, since radiation areas of an ultraviolet beam are limited, and the adhesive strength of the entire area to which the semiconductor chip 5 are fixed is not decreased, the remaining semiconductor chips on the adhesive tape 4 can be re-stored while they are kept adhered and fixed to the tape 4 with a large adhesive strength.

The above-described radiation of the ultraviolet beam may be performed in the following manner. An ultraviolet beam emitted from the ultraviolet source 8 may be focused and guided by a light guide or the like so as to sequentially radiate a beam spot onto the corresponding corner portions of the respective semiconductor chips 5. Further, after radiation of an ultraviolet beam, the semiconductor chip 5 can be immediately chucked/held by the collect 7 and can be then peeled off and picked up from the adhesive tape 4 without using the push-up means.

An experiment result obtained by applying the present invention to a pickup operation of a semiconductor chip having an area of 5 mm² will be described below.

The adhesive/fixing power of a semiconductor chip was about 300 g prior to radiation of an ultraviolet means. After an ultraviolet beam was radiated on a portion to which a corresponding corner portion of the semiconductor chip was fixed, the adhesive/fixing strength was decreased to 250 g. When the above-described pickup operation was performed in this state, the frequency of defects, such as cracks and chips of semiconductor chips, occurring when they were pushed up was substantially equal to that of a conventional method in which the adhesive strength was reduced to 100 g by radiating an ultraviolet beam on the entire adhesive area. In addition, since portions to which an ultraviolet was radiated to decrease the adhesive strength were limited, the remaining semiconductor chips 5 on the adhesive tape 4 could be re-stored with a sufficient adhesive strength.

The present invention is not limited to the above-described embodiment, and various modifications of the invention can be made.

In the above embodiment, the present invention is applied to a case wherein the semiconductor chips 5 adhered and fixed to the adhesive tape 4 are picked up. However, the present invention is not limited to this. For example, the present invention can be applied to a pickup operation of the chip type parts such as chip capacitors and chip resistors adhered and fixed to an adhesive tape such as an adhesive tape.

Furthermore, in the above embodiment, an ultraviolet beam is used as an energy beam. However, it is preferable that an energy beam is selected in accordance with an adhesive material used for an adhesive tape such as an adhesive tape so as to efficiently decrease its adhesive strength. For example, with respect to an adhesive tape coated with an adhesive material whose adhesive strength is efficiently decreased upon radiation of an infrared beam, an infrared beam is preferably used as an energy beam.

In addition, in the above embodiment, the push-up means is constituted by the four push-up pins. However, the push-up means need not have the push-up pins but may have a flat portion instead, which is brought into contact with an adhesive tape such as an adhesive tape. Even in this case, the flat portion is brought into contact with an adhesive tape at a plurality of portions in a microscopic viewpoint. In this case, however, in order to prevent the push-up means from coming contact with radius of 5% of the diagonal line strength from a corner of a semiconductor chip which is fixed to a portion on which an ultraviolet beam is radiated, a corresponding portion of the means must be notched or any similar processing must be preformed in advance.

Figure 8A:
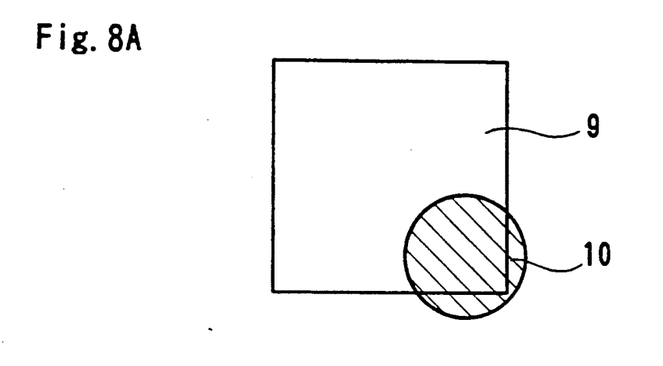
FIGS. 8A to 8C are bottom end views each showing a portion of an adhesive area on which an ultraviolet beam is radiated.
Figure 8B:
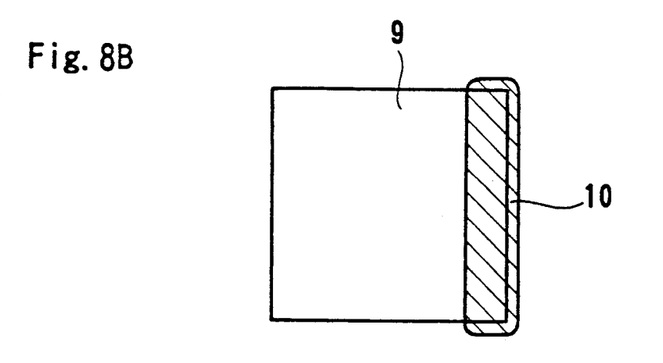
Figure 8C:
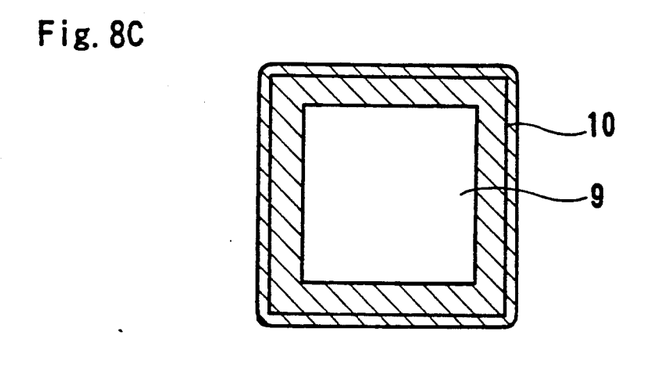

Next, some modifications of the second embodiment for the present invention will be explained in reference to FIG. 5 and FIGS. 8A to 8C. In the above-described embodiment, as shown in FIG. 8A, a portion 10 (hatched portion) of an adhesive area 9 to which an ultraviolet beam is radiated corresponds to a portion to which a corner portion of the semiconductor chip 5 is fixed. However, an ultraviolet beam may be radiated on a hatched portion 10 shown in FIG. 8B or 8C wherein FIG. 8B shows the radiated portion to comprise one perimetral edge of the chip. In this case, the portion 10 on which an ultraviolet beam is radiated preferably includes a portion to which at least one of the corner portions of the semiconductor chip 5 is adhered and fixed. This is because peeling of the adhesive tape 4 tends to start from this corner portion. Note that such a modification of the portion 10 for receiving an ultraviolet beam can be made by only changing the mask 9 in accordance with the corresponding specifications.

Next, the third embodiment for the present invention will be explained below with reference to FIGS. 9A and 9B. The difference between the third embodiment and the second embodiment is as follows. Of these pins, the push-up pin 6a has a distal end located farther from the adhesive tape 4 than the distal ends of the other push-up pins 6b to 6d. That is, the distal end of the push-up pin 6a, which is positioned to correspond to a diagonal corner portion with respect to a corner portion of the semiconductor chip 5 which is fixed to the portion on which the ultraviolet beam is radiated, is located farther from the adhesive tape 4 than the distal ends of the other push-up pins 6b to 6b.

Figure 9A:
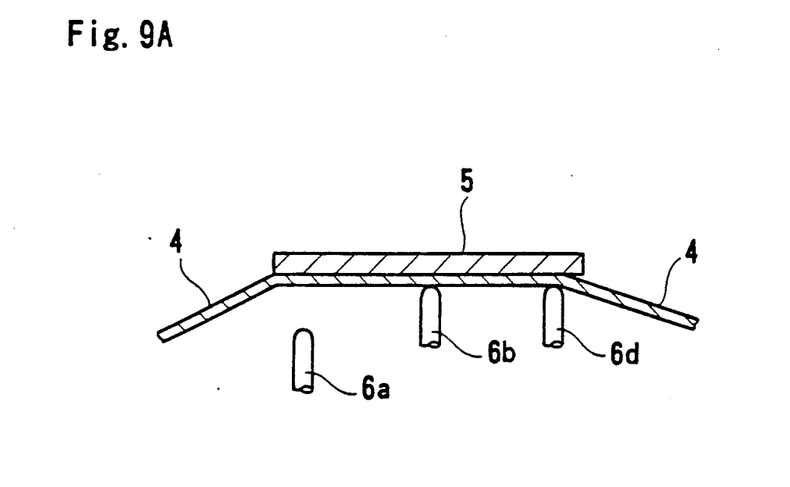
FIGS. 9A and 9B are vertical sectional views showing a state wherein an adhesive tape is peeled off from a semiconductor chip.
Figure 9B:
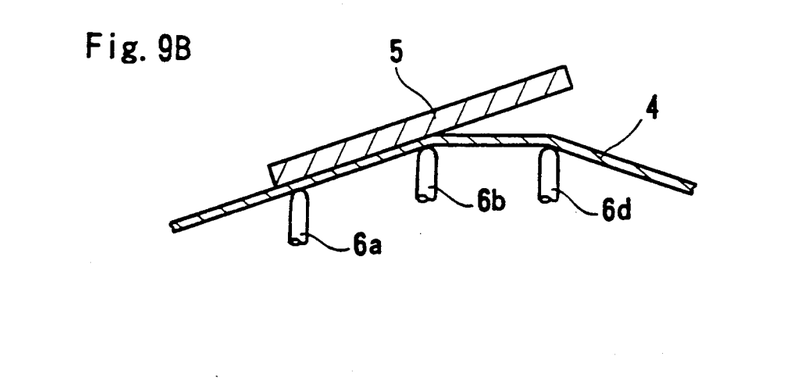

FIGS. 9A and 9B show a state wherein the semiconductor chip 5 is pushed up by the push-up pins 6a to 6d, and the adhesive tape 4 is peeled off from the semiconductor chip 5.

As shown in FIG. 9A, when the semiconductor chip 5 is pushed up by the push-up pins 6b to 6d, since the adhesive power of a portion of the adhesive tape 4 on which an ultraviolet beam is radiated is decreased, peeling of the adhesive tape 4 easily occurs from this portion. Since no force for pulling the semiconductor chip 5 downward acts on the portion where the adhesive tape 4 is peeled off, the balance between the forces for pulling the semiconductor chip 5 downward which act on the two sides of the diagonal line connecting the push-up pins 6b and 6c is lost. Since the distal end of the push-up pin 6a is separated from the adhesive tape 4, the semiconductor chip 5 is tilted from the diagonal line as a center line, as shown in FIG. 9B. As a result, the peeled corner portion is separated from the pin 6d to float, and peeling of the adhesive tape 4 proceeds to the central portion of the semiconductor chip 5. The pushed-up semiconductor chip 5 is chucked and held by the collet positioned above this semiconductor chip 5. The upper surface of the semiconductor chip 5 is pressed by the collet 7, the chip 5 is tilted in the reverse direction (clockwise direction) to allow the chip 5 to close the chuck opening of the collet 7 (Refer FIG. 7). After that, the collet is moved upward, the semiconductor chip 5 is peeled off from the adhesive tape 4 to be picked up. In this case, if a portion of the peripheral portion of an adhesive area to which the semiconductor chip 5 is adhered and fixed (corresponding to the corner portion of the semiconductor chip 5 fixed to the area on which the ultraviolet beam is radiated) is peeled off, peeling of this portion facilitates a smooth peeling operation of the overall adhesive area even if the adhesive strength thereof is not decreased. Therefore, even a large, flattened semiconductor chip can be easily peeled off from an adhesive tape to be picked up without increasing the suction power of the collet 7.

In addition, assume that some of the semiconductor chips 5 adhered and fixed to the adhesive tape 4 are picked up, and the remaining semiconductor chip 5 are stored while they are kept adhered and fixed to the adhesive tape 4. Even in such a case, since radiation areas of an ultraviolet beam are limited, and the adhesive power of the entire area to which the semiconductor chips 5 are fixed is not decreased, the remaining semiconductor chips on the adhesive tape 4 can be re-stored while they are kept adhered and fixed to the tape 4 with an adhesive power large enough to store them.

Figure 10:
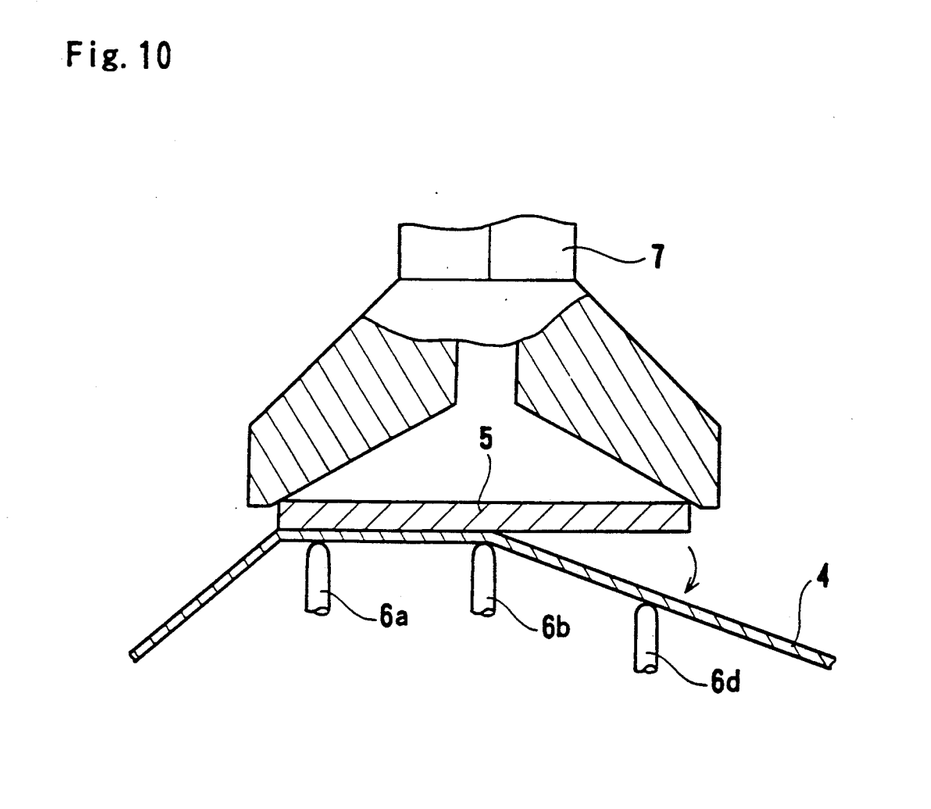
FIG. 10 is a vertical sectional view showing a state wherein an adhesive tape is peeled off from a semiconductor chip.

The fourth embodiment of the present invention, which is different from the above-described embodiment, will be described below with reference to FIG. 10.

In the embodiment described with reference to FIGS. 9A to 9C, the distal end of the push-up pin 6a on the side diagonal to the portion on which the ultraviolet beam is radiated is separated from the adhesive tape 4. In contrast to this, in the fourth embodiment, as shown in FIG. 10, the distal end of a push-up pin 6d, which is arranged at a position corresponding to a corner portion of a semiconductor chip 5 which is fixed to a portion on which an ultraviolet beam is radiated, is located farther from an adhesive tape than other push-up pins 6a to 6c. When the push-up pins 6a to 6c are brought into contact with the adhesive tape 4 to push up the semiconductor chip 5, peeling of the adhesive tape 4 starts from a portion with which no push-up pin is in contact and has adhesive power decreased upon radiation of an ultraviolet beam, and this peeling progresses to the central portion of the semiconductor chip 5. The semiconductor chip 5 is chucked and held by a collet 7. The semiconductor chip 5 is then peeled off from the adhesive tape 4 to be picked up. In this case, since the semiconductor chip 5 does not tilt as shown in FIG. 10, the semiconductor chip 5 can be easily chucked and held by the collet 7. Therefore, this embodiment is preferable to the previous embodiment.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of picking up a chip part fixed on an adhesive layer formed on a tape member through which an energy beam is transmitted, the adhesive layer having an adhesive strength decreased upon radiation of the energy beam, comprising the steps of:
   radiating the energy beam, through said tape member, onto only a predetermined portion of said adhesive layer to which said chip part is fixed, wherein said predetermined portion is less than the total surface area of the chip, for leaving the other portion thereof adhered; and
   causing a collet to hold and peel off said chip part from the side of the tape opposite the energy beam.

2. A method according to claim 1, wherein when a polygonal bottom surface of the chip part is fixed to said adhesive layer, said predetermined portion of said adhesive layer is an adhesive layer for fixing a corner of said polygonal bottom surface.

3. A method according to claim 1, wherein when a polygonal bottom surface of the chip part is fixed to said adhesive layer, said predetermined portion of said adhesive layer is an adhesive layer for fixing one perimetral edge of said polygonal bottom surface.

4. A method according to claim 1, wherein when a polygonal bottom surface of the chip part is fixed to said adhesive layer, said predetermined portion of said adhesive layer is an adhesive layer for fixing a portion inside an outer edge of said polygonal bottom surface.

5. A method of picking up a chip part fixed to an adhesive layer formed on a tape member through which an energy beam is transmitted, the adhesive layer having an adhesive strength decreased upon radiation of the energy beam, comprising the steps of:
   radiating the energy beam, through said tape member, onto only a predetermined portion of said adhesive layer to which said chip part is fixed, wherein said predetermined portion is less than the total surface area of the chip, for leaving the other portion thereof adhered; and
   bringing a plurality of pins into contact with said tape member and pushing up the chip part from said tape member away from said adhesive layer by said plurality of pins; and
   causing a collet to hold and peel off said chip part.

6. A method according to claim 5, wherein when a polygonal bottom surface of the chip part is fixed to said adhesive layer, a plurality of pins are brought into contact with the chip part wherein one of the pins is positioned separated from a corner of the chip part fixed on said predetermined portion of said adhesive layer by not less than a distance corresponding to 5% of a diagonal line length of said polygonal bottom surface, and the chip part is pushed up.

7. A method according to claim 5, wherein when a polygonal bottom surface of the chip part is fixed to said adhesive layer, a distal end of at least one of the group of a pin located at said predetermined portion of said adhesive layer and a pin located at a corner farthest from said predetermined portion, is brought into contact with said tape member with a lapse of time from contact between said tape member and distal ends of other pins.

8. An apparatus for picking up a chip part fixed to an adhesive layer formed on a tape member through which an energy beam is transmitted, said adhesive layer having an adhesive strength decreased upon radiation of the energy beam, comprising:
   radiation means radiating the energy beam, through said tape member, onto only a predetermined portion of the adhesive layer to which said chip part is fixed, wherein said predetermined portion is less than the total surface area of the chip, for leaving the other portion thereof adhered; and
   a collet for holding said chip part and peeling off the chip part from the side of the tape opposite the energy beam.

9. An apparatus according to claim 8, wherein said radiation means includes an energy source for generating the energy beam, and a mask member, located between said energy source and said adhesive tape, for causing the energy beam to transmit through only said predetermined portion of said adhesive layer.

10. An apparatus according to claim 8, wherein said mask member is made of a member which does not cause the energy beam to transmit therethrough and which has a through hole at said predetermined portion of said adhesive layer.

11. An apparatus according to claim 8, wherein said mask member is made of a material for causing the energy beam to transmit through only said predetermined portion of said adhesive layer.

12. An apparatus according to claim 8, wherein
said chip part has a polygonal bottom surface fixed to said adhesive layer, and
said predetermined portion of said adhesive layer is an adhesive layer for fixing a corner of said polygonal bottom surface.

13. An apparatus according to claim 8, wherein
said chip part has a polygonal bottom surface fixed to said adhesive layer, and
said predetermined portion of said adhesive layer is an adhesive layer for fixing one perimetral edge of said polygonal bottom surface.

14. An apparatus according to claim 8, wherein said predetermined portion of said adhesive layer is an adhesive layer for fixing a portion of said polygonal bottom surface inside an outer edge thereof.

15. An apparatus according to claim 8, further comprising push-up means for pushing up the chip part toward said collet through said tape member.

16. An apparatus according to claim 15, wherein
said chip part has a polygonal bottom surface fixed to said adhesive layer, and
said push-up means comprises a plurality of pins, which are located at positions corresponding to said corners of said polygonal bottom surface and distal ends of which are brought into contact with said tape member from a side opposite to said adhesive layer, for pushing up said chip part.

17. An apparatus according to claim 16, wherein of said plurality of pins, a distal end of at least one of the group of a pin located at said predetermined portion of said adhesive layer and a pin located at a corner farthest from said predetermined portion, is farther separated from said adhesive tape than distal ends of other pins.

18. An apparatus according to claim 16, wherein said plurality of pins comprise a plurality of pins which are in contact with said tape member wherein one of the pins is positioned separated from a corner of the chip part fixed on said predetermined portion of said adhesive layer by not less than a distance corresponding to 5% of a diagonal line length of said polygonal bottom surface.

19. An apparatus according to claim 15, wherein said push-up means is brought into contact with said tape member from a side opposite to said adhesive layer by means of a flat member obtained by notching said predetermined portion of said adhesive layer, and said push-up means pushes up said chip part.

* * * * *